United States Patent
Brody et al.

(10) Patent No.: US 7,268,431 B2
(45) Date of Patent: *Sep. 11, 2007

(54) SYSTEM FOR AND METHOD OF FORMING VIA HOLES BY USE OF SELECTIVE PLASMA ETCHING IN A CONTINUOUS INLINE SHADOW MASK DEPOSITION PROCESS

(75) Inventors: Thomas P. Brody, Pittsburgh, PA (US); Joseph A. Marcanio, Latrobe, PA (US)

(73) Assignee: Advantech Global, Ltd, Tortola (VG)

( * ) Notice: Subject to any disclaimer, the term of this patent is extended or adjusted under 35 U.S.C. 154(b) by 322 days.

This patent is subject to a terminal disclaimer.

(21) Appl. No.: 11/026,365

(22) Filed: Dec. 30, 2004

(65) Prior Publication Data

US 2006/0148241 A1 Jul. 6, 2006

(51) Int. Cl.
*H01L 23/52* (2006.01)
(52) U.S. Cl. .............................. 257/758; 257/E21.577; 438/637; 438/675
(58) Field of Classification Search ................ 257/758
See application file for complete search history.

(56) References Cited

U.S. PATENT DOCUMENTS

| | | | |
|---|---|---|---|
| 4,853,345 A | 8/1989 | Himelick | |
| 6,031,289 A * | 2/2000 | Fulford et al. | 257/758 |
| 2001/0053586 A1 | 12/2001 | Lee et al. | |
| 2002/0109521 A1 * | 8/2002 | Almonte et al. | 324/765 |
| 2003/0193285 A1 | 10/2003 | Kim | |
| 2003/0218254 A1 | 11/2003 | Kurimoto et al. | |
| 2004/0003775 A1 | 1/2004 | Kim | |
| 2004/0137719 A1 | 7/2004 | Jin | |
| 2006/0141763 A1 * | 6/2006 | Brody et al. | 438/622 |

* cited by examiner

*Primary Examiner*—Tu-Tu V. Ho
(74) *Attorney, Agent, or Firm*—The Webb Law Firm

(57) ABSTRACT

In a shadow mask vapor deposition system, a first conductor is vapor deposited on a substrate and an insulator is vapor deposited on the first conductor. A second conductor is then vapor deposited on at least the insulator. The insulator layer is plasma etched either before or after the vapor deposition of the second conductor to define in the insulator layer a via hole through which at least a portion of the first conductor is exposed. An electrical connection is established between the first and second conductors by way of the via hole.

20 Claims, 9 Drawing Sheets

SYSTEM FOR AND METHOD OF FORMING VIA HOLES BY USE OF SELECTIVE PLASMA ETCHING IN A CONTINUOUS INLINE SHADOW MASK DEPOSITION PROCESS

BACKGROUND OF THE INVENTION

1. Field of the Invention

The present invention relates to a shadow mask deposition system and method for forming electronic elements on a substrate and, more particularly, to forming via holes in a shadow mask deposition process.

2. Description of Related Art

Generally, in a multi-layer electronic device, such as a semiconductor device, a via is needed to provide a conductive path through a non-conductive layer (insulator or dielectric layer), in order to connect two or more conducting layers. A via is a structure formed by filling or lining a via hole (or through-hole) with conductive material, which is used to electrically connect two or more conducting layers in a multi-layer substrate.

The creation of vias in typical microcircuit fabrication processes is accomplished by applying a pattern or stencil of etch resistant material over the layer through which the via is to be formed and subsequently applying an etching medium to the wafer to remove areas unprotected by the etch resistant material. The etch resistant material, known as photoresist, is patterned by a process called photolithography, which is a subtractive wet chemical process.

Because photolithography is a subtractive process, it is a process that lends well to the formation of via holes in the manufacture of multi-layer electrical devices. The multi-layer electrical device fabrication process includes numerous deposition and etching steps in order to define appropriate patterns of conductors, insulators and vias. Exemplary photolithography processing steps that produce vias in a multi-layer electrical device include: applying a photoresist pattern of via holes upon an insulator layer; developing the image whereupon photoresist remains everywhere except at the via locations; baking the image; etching the structure whereupon the etching material dissolves the insulator layer but not the photoresist, thereby forming a hole in the insulator layer in the areas where there is no photoresist without damaging an underlying conductor; and removing the remaining photoresist which leaves the insulation layer (with via holes therethrough) on top of the underlying conductor. As can be seen, the multi-layer electrical device fabrication process utilizes numerous deposition and etching steps in order to define one or more appropriate patterns, especially vias.

Because of the number of steps required to form multi-layer electronic devices, such as semiconductor devices, with the photolithographic manufacturing process, foundries of adequate capacity for volume production are very expensive. Furthermore, because of the nature of the fabrication process, the production equipment must be utilized in a class one or class ten clean room. In addition, because of the amount of equipment needed and the size of each piece of equipment, the clean room must have a relatively large area, which can be relatively expensive.

A vapor deposition shadow mask process is well known and has been used for years in microelectronics manufacturing. The vapor deposition shadow mask process is a significantly less costly and less complex manufacturing process compared to the photolithography process. However, in contrast to the photolithography manufacturing process, the vapor deposition shadow mask process is an additive process that is performed in a vacuum environment. In order to form a pattern by shadow mask vacuum deposition, an opening (aperture) is required in the mask to allow material to pass therethrough. However, to make a non-deposit area (such as a via hole), a blockage is needed in the mask to block the area from material being deposited thereon. Therefore, in order to make a via hole, a land mass in the form of an unconnected island is needed to block the via location. This is not possible with a shadow mask because there would be no material to support the blocked area.

Furthermore, a continuous inline, reel-to-reel shadow mask deposition process, which is an additive process, presents a technical challenge in making via holes without disrupting the process. For example, it is inefficient and impractical to insert one or more photolithography steps into a highly efficient inline, reel-to-reel shadow mask deposition process.

Therefore, what is needed, and not disclosed in the prior art, is a method and apparatus for forming a via hole in an automated shadow mask vacuum deposition process.

SUMMARY OF THE INVENTION

The invention is a shadow mask vapor deposition method that comprises (a) vapor depositing a first conductor layer on a substrate; (b) vapor depositing an insulator layer on the first conductor layer; (c) plasma etching the insulator layer to define therein a via hole through which at least a portion of the first conductor layer is exposed; and (d) vapor depositing a second conductor layer on at least the insulator layer, wherein an electrical conductor in the via hole electrically connects the first and second conductor layers.

The electrical conductor can be formed by a deposit of the second conductor layer in the via hole.

Step (c) can include plasma etching the insulator layer by way of an aperture in a shadow mask to define the via hole in the insulator layer. Alternatively, step (d) can include vapor depositing the second conductor layer in a manner to define an opening in the second conductor layer and step (c) can include plasma etching the insulator layer by way of the opening in the second conductor layer to define the via hole in the insulator layer.

The method can further include (e) vapor depositing a conductive filler in the via hole by way of an aperture in a shadow mask and the opening in the second conductive layer whereupon the conductive filler forms the electrical conductor.

Step (d) can include vapor depositing a first portion of the second conductor layer and vapor depositing a second portion of the second conductor layer such that it overlaps the first portion of the second conductor layer. The opening in the second conductor layer can be formed solely by the vapor depositions of the first and second portions of the second conductor layer.

Each vapor depositing step can occur by way of a different shadow mask. Before vapor depositing each layer, the substrate can be translated into a desired position with respect to the corresponding shadow mask.

The invention is also a shadow mask vapor deposition method that comprises (a) vapor depositing a first conductor on a substrate; (b) vapor depositing an insulator on the first conductor; (c) vapor depositing a second conductor on at least the insulator; and (d) plasma etching the insulator either before or after step (c) to define in the insulator a via hole through which at least a portion of the first conductor is exposed, wherein an electrical connection is established between the first and second conductors by way of the via hole.

When the via hole is defined before step (c), step (c) can include vapor depositing the second conductor in the via hole thereby establishing the electrical connection between the first and second conductors. The insulator can be plasma etched by way of an aperture in a shadow mask.

When the via hole is defined after step (c), the method can further include vapor depositing a conductive filler in the via hole by way of an opening defined in the second conductor solely by the vapor deposition of the second conductor in step (c), whereupon the conductive filler establishes the electrical connection between the first and second conductors. The insulator can be plasma etched by way of the opening in the second conductor.

At least one of the first conductor and the second conductor can be formed from at least one of molybdenum, aluminum, gold, copper, nickel and titanium. The insulator can be formed from one of silicon dioxide, aluminum oxide and tantalum pentoxide.

Before each vapor depositing step, the method can include translating the substrate into position to receive the corresponding vapor deposit.

Lastly, the invention is a shadow mask vapor deposition system. The system includes means for vapor depositing a first conductor on a substrate; means for vapor depositing an insulator on the first conductor; means for vapor depositing a second conductor on at least the insulator; and means for plasma etching the insulator, either before or after vapor depositing the second conductor, to define in the insulator a via hole through which at least a portion of the first conductor is exposed. An electrical connection is established between the first and second conductors by way of the via hole.

Where the via hole is defined before vapor depositing the second conductor, the means for plasma etching can include a shadow mask having an aperture therein. The insulator can be plasma etched by way of the aperture in the shadow mask to form the via hole and the means for vapor depositing the second conductor vapor can deposit the second conductor in the via hole thereby establishing the electrical connection between the first and second conductors.

Where the via hole is defined after vapor depositing the second conductor, the means for vapor depositing the second conductor can include a first shadow mask for depositing a first portion of the second conductor and a second shadow mask for depositing a second portion of the second conductor overlapping the first portion of the second conductor. An opening can be defined in the second conductor adjacent where the second portion of the second conductor overlaps the first portion of the second conductor solely by the vapor deposition of the second conductor. The insulator can be plasma etched by way of the opening.

The system can further include means for vapor depositing a conductive filler in the via hole by way of an aperture in a shadow mask and the opening defined in the second conductor, whereupon the conductive filler establishes the electrical connection between the first and second conductors.

Each means for vapor depositing can include a vacuum vessel, a deposition source disposed in the vacuum vessel and charged with a material to be deposited thereby, and a shadow mask disposed in the vacuum vessel and having a pattern of apertures corresponding to a desired pattern of the material to be deposited by the deposition source. The shadow mask can be positioned between the substrate and the deposition source during vapor depositing of the material.

The means for plasma etching can include a vacuum vessel and a plasma source disposed in the vacuum vessel. The system can further include means for translating the substrate into each vacuum vessel.

DETAILED DESCRIPTION OF THE INVENTION

Figure 1:
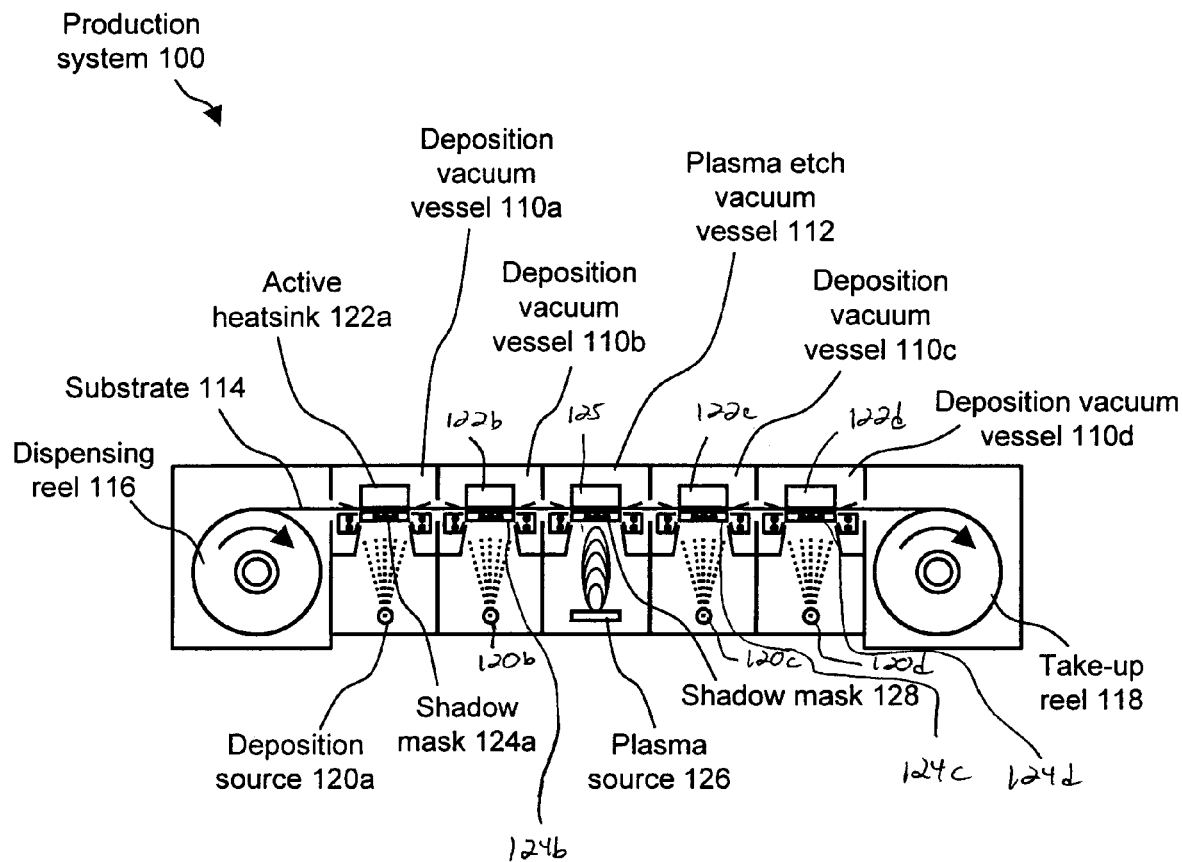
FIG. 1 is a diagrammatic illustration of a production system for forming via holes by use of selective plasma etching in the production of a multi-layer electronic device.

With reference to FIG. 1, a production system 100 for performing a continuous inline shadow mask deposition process to form via holes by use of selective plasma etching in the production of a multi-layer electronic device includes a plurality of deposition vacuum vessels 110 (e.g., deposition vacuum vessels 110a, 110b, 110c and 110d) and at least one plasma etch vacuum vessel 112. Production system 100 is not limited to four deposition vacuum vessels 110 and one plasma etch vacuum vessel 112. Rather, the configuration shown in FIG. 1 is intended to be exemplary only. The number and arrangement of deposition vacuum vessels 110 and plasma etch vacuum vessel(s) 112 are dependent on the number of deposition events and etching events required for any given product formed therewith.

In use of production system 100, a substrate 114 translates through the serially arranged deposition vacuum vessels 110 and plasma etch vacuum vessel 112 by use of a reel-to-reel mechanism that includes a dispensing reel 116 and a take-up reel 118. Each deposition vacuum vessel 110 includes a deposition source 120, an active heatsink 122 and a shadow mask 124. For example, deposition vacuum vessel 110a includes a deposition source 120a, an active heatsink 122a and a shadow mask 124a; deposition vacuum vessel 110b includes a deposition source 120b, an active heatsink 122b and a shadow mask 124b; deposition vacuum vessel 110c includes a deposition source 120c, an active heatsink 122c and a shadow mask 124c; deposition vacuum vessel 110d includes a deposition source 120d, an active heatsink 122d and a shadow mask 124d, and so forth, for any number of deposition vacuum vessels 110. Plasma etch vacuum vessel 112 includes an active heatsink 125, a plasma source 126 and a shadow mask 128.

Deposition vacuum vessels 110 are arranged and connected in series. Each deposition source 120 is charged with a desired material to be deposited onto substrate 114 through its associated shadow mask 124, which is held in intimate contact with substrate 114 in the corresponding deposition vacuum vessel 110 during the deposition of the desired material on substrate 114.

Plasma etch vacuum vessel 112 is representative of a vessel where a well-known physical and chemical etching operation occurs that employs reactive ionized gas to remove unprotected portions of a layer of material. More specifically, plasma source 126 within plasma etch vacuum vessel 112 generates an ionized gas, i.e., an electrically energized plasma gas, which is commonly used in the semiconductor industry to remove resist, to etch or to deposit various layers onto a wafer. The plasma gas contains highly excited molecules (reactive ions) which easily react chemically. The plasma gas from plasma source 126 impinges upon the surface of substrate 114 through apertures of shadow mask 128 which is held in intimate contact with substrate 114 during the plasma etch operation. In production system 100, the etching operation that occurs within plasma etch vacuum vessel 112 is for the purpose of forming via holes which are subsequently filled with a conductive material by use of a downstream deposition vacuum vessel 110 to link two or more conducting layers on substrate 114. The etching operation of plasma etch vacuum vessel 112 to form via holes will be described in greater detail hereinafter.

Each active heatsink 122 and 125 provides a flat reference surface that is in contact with the non-deposition side of substrate 114 and serves as a heat removal mechanism for substrate 114 as it translates through production system 100.

Each shadow mask 124 in production system 100 includes a unique pattern of apertures (not shown), e.g., slots and holes. The unique pattern of apertures formed in the shadow masks 124 correspond to a desired pattern of material(s) to be deposited on substrate 114 from deposition sources 120 in deposition vacuum vessels 110 as substrate 114 is advanced through production system 100.

Each shadow mask 124 is formed of, for example, nickel, chromium, steel, copper, Kovar® or Invar®, and has a thickness of, for example, 150-200 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Del., and Invar® is a registered trademark, Registration No. 63,970, currently owned by Imphy S.A. Corporation of France.

Those skilled in the art will appreciate that production system 100 may include additional stages (not shown), such as an anneal stage, a test stage, one or more cleaning stages, a cut and mount stage, and the like, as is well known. In addition, the number, purpose and arrangement of deposition vacuum vessels 110 can be modified, as needed, for depositing one or more materials required for a particular application by one of ordinary skill in the art. An exemplary production system 100 is disclosed in U.S. Patent Application Publication No. 2003/0228715, entitled "Active Matrix Backplane For Controlling Controlled Elements And Method Of Manufacture Thereof", which is incorporated herein by reference.

As is well known, deposition vacuum vessels 110 can be utilized for depositing materials on substrate 114 in order to form one or more electronic elements on substrate 114. Each electronic element may be, for example, a thin film transistor (TFT), a diode, a memory element or a capacitor. A multilayer circuit can be formed solely by successive depositions of materials on substrate 114 via successive operations in deposition vacuum vessels 110.

Each deposition vacuum vessel 110 is connected to a source of vacuum (not shown) that is operative for establishing a suitable vacuum therein in order to enable a charge of material disposed in the corresponding deposition source 120 to be deposited on substrate 114 in a manner known in the art, e.g., sputtering or vapor phase deposition, through apertures in the corresponding shadow mask 124. Likewise, plasma etch vacuum vessel 112 is connected to a source of vacuum (not shown) that is operative for establishing a suitable vacuum therein.

In the following description, substrate 114 is described as a continuous flexible sheet, which is dispensed from dispensing reel 116 into the first deposition vacuum vessel 110a. Dispensing reel 116 is positioned in a preload vacuum vessel, which is connected to a source of vacuum (not shown) that is operative for establishing a suitable vacuum therein. The description of substrate 114 as being a continuous flexible sheet, however, is not to be construed as limiting the invention since production system 100 can be configured to continuously process a plurality of individual or standalone substrates 114. Each deposition vacuum vessel 110 can include supports or guides that avoid substrate 114 from sagging as it is advanced therethrough.

In operation of production system 100, the material disposed in each deposition source 120 is deposited on the portion of substrate 114 positioned in the corresponding deposition vacuum vessel 110 through the corresponding shadow mask 124 in the presence of a suitable vacuum as substrate 114 is advanced through the deposition vacuum vessel 110 by the action of dispensing reel 116 and take-up reel 118. More specifically, substrate 114 has plural portions, each of which is positioned for a predetermined interval in each deposition vacuum vessel 110. During this predetermined interval, material is deposited from the corresponding deposition source 120 onto the portion of substrate 114 that is positioned in the corresponding deposition vacuum vessel 110. After this predetermined interval, substrate 114 is step advanced, whereupon the portion of substrate 114 is advanced to the next vacuum vessel in series for additional processing, as applicable. This step advancement continues until each portion of substrate 114 has passed through all deposition vacuum vessels 110. Thereafter, each portion of substrate 114 exiting the final deposition vacuum vessel 110 in the series is received on take-up reel 118, which is positioned in a storage vacuum vessel (not shown). Alternatively, each portion of substrate 114 exiting production system 100 is separated from the remainder of substrate 114 by a cutter (not shown). Additionally, during this predetermined interval, material of a portion of substrate 114 is etched away to form via holes by use of plasma source 126 and shadow mask 128 within plasma etch vacuum vessel 112.

Figure 2A:
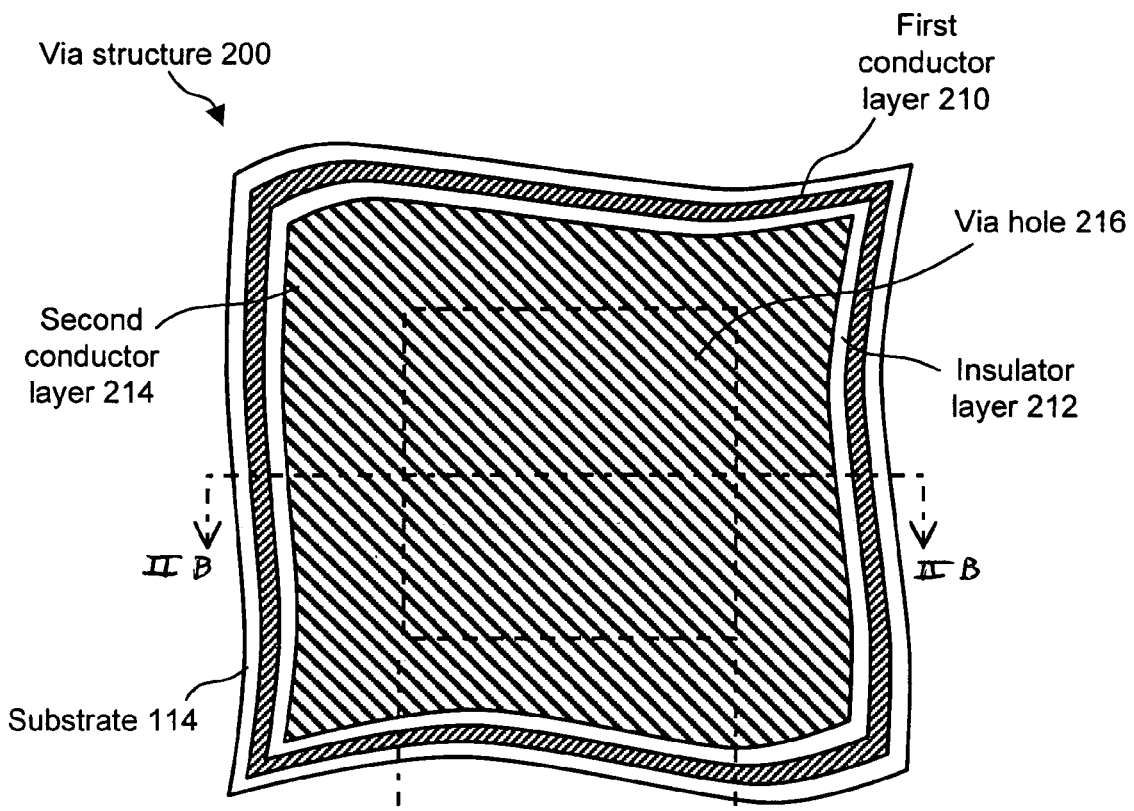
FIG. 2A is a top view of a via structure formed in the production system of FIG. 1 in accordance with a first embodiment of the invention.
Figure 2B:
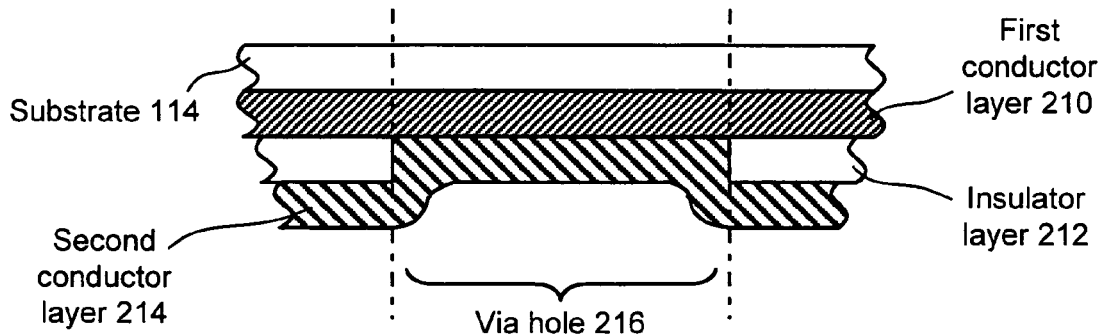
FIG. 2B is a cross section taken along line IIB-IIB in FIG. 2A.

With reference to FIGS. 2A and 2B, a via structure 200 can be formed by use of production system 100 in accordance with a first embodiment of the invention. Via structure 200 includes a first conductor layer 210 deposited atop substrate 114; a non-conductive insulator layer 212 deposited atop first conductor layer 210; a second conductor layer 214 deposited atop insulator layer 212; and a via hole 216. Via hole 216 is a region where a conductive path is formed between first conductor layer 210 and second conductor layer 214. The shape of via hole 216 is not limited to being square. Rather, via hole 216 may be any desired shape, such as, without limitation, circular, oval or rectangular.

First conductor layer 210 and second conductor layer 214 are formed of typical metals used to form interconnection layers in semiconductor fabrication. Such metals include, without limitation, one or more of molybdenum, aluminum, gold, copper, nickel, titanium, metal alloys and other metal compounds. Insulator layer 212 is a non-conductive layer formed of any common circuit insulator material that can be etched, such as, without limitation, silicon dioxide ($SiO_2$), aluminum oxide ($Al_2O_3$), tantalum pentoxide ($Ta_2O_5$), and the like.

As shown in FIG. 2B, via hole 216 comprises a region within insulator layer 212, wherein a portion of the surface of first conductor layer 210 is exposed, and wherein the material of second conductor layer 214 is allowed to fill during the deposition of second conductor layer 214. The material of second conductor layer 214 filling via hole 216 forms an electrical connection (or defines an electrical conductor) between first conductor layer 210 and second conductor layer 214. Outside the region defined by via hole 216, first conductor layer 210 and second conductor layer 214 are electrically isolated by insulator layer 212. Via hole 216 is formed within insulator layer 212 by a plasma etch operation within plasma etch vacuum vessel 112 of production system 100, whereupon a portion of the material of insulator layer 212 is removed. The formation of via structure 200 will be described in greater detail hereinafter.

It is envisioned that other conductive and/or non-conductive layers of material may be deposited on substrate 114. For simplicity, these other conductive and/or non-conductive layers are not shown in FIGS. 2A and 2B. Furthermore, while via hole 216 is a single via that corresponds to a single conduction path, it is to be understood that via hole 216 is representative of one or more vias within a given multi-layer electronic structure.

Figure 3:
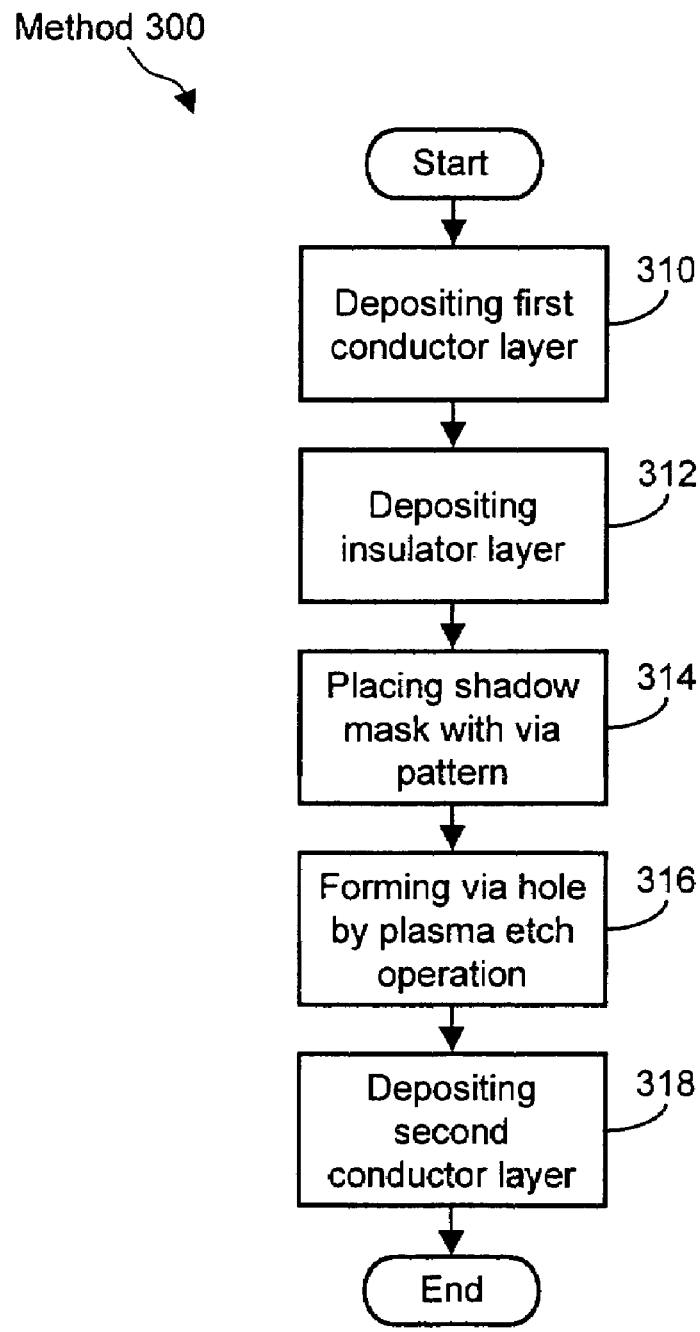
FIG. 3 is a flow diagram of a method of making the via structure of FIGS. 2A and 2B.

With reference to FIG. 3 and with continuing reference to FIGS. 1-2B, a method 300 of making via structure 200 includes step 310, wherein substrate 114 is advanced into, for example, deposition vacuum vessel 110a of production system 100 by use of the reel-to-reel system formed by dispensing reel 116 and take-up reel 118. Shadow mask 124a is then aligned and brought into intimate contact with substrate 114 and a first conductive layer, such as first conductor layer 210, is deposited on substrate 114 by deposition source 120a through the aperture pattern of shadow mask 124a.

The method then advances to step 312, wherein substrate 114 is advanced into, for example, deposition vacuum vessel 110b of production system 100 by use of the reel-to-reel system. Shadow mask 124b is then aligned and brought into intimate contact with substrate 114 and an insulator layer, such as insulator layer 212, is deposited on first conductor layer 210 by deposition source 120b through the aperture pattern of shadow mask 124b. At the completion of this step, insulator layer 212 may a continuous blanket or sheet of material with no openings therein. However, this is not to be construed as limiting the invention since insulator layer 212 can comprise one of a plurality of insulator layers (not shown) deposited on first conductor layer 210.

The method then advances to step 314, wherein substrate 114 is advanced into, for example, plasma etch vacuum vessel 112 of production system 100 by use of the reel-to-reel system. Shadow mask 128 is aligned and brought into intimate contact with substrate 114. Shadow mask 128 is formed of, for example, nickel, chromium, steel, copper, Kovar® or Invar®, and includes an aperture 410, shown best in FIG. 4, that corresponds to the size and shape of via hole 216 shown in FIGS. 2A and 2B. While aperture 410 is a single aperture that corresponds to a single via hole 216, it is to be understood that aperture 410 is representative of one or more apertures within shadow mask 128. The placement and pattern of apertures 410 correspond to the desired locations and pattern of via holes 216 for a given multi-layer electronic device structure.

Figure 5A:
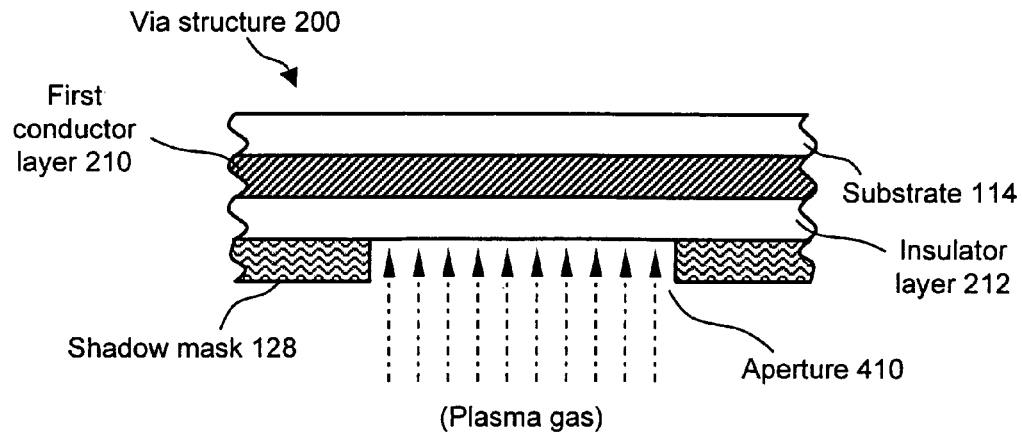
FIGS. 5A, 5B and 5C illustrate sequential process steps of forming a via hole of the via structure of FIGS. 2A and 2B.
Figure 5B:
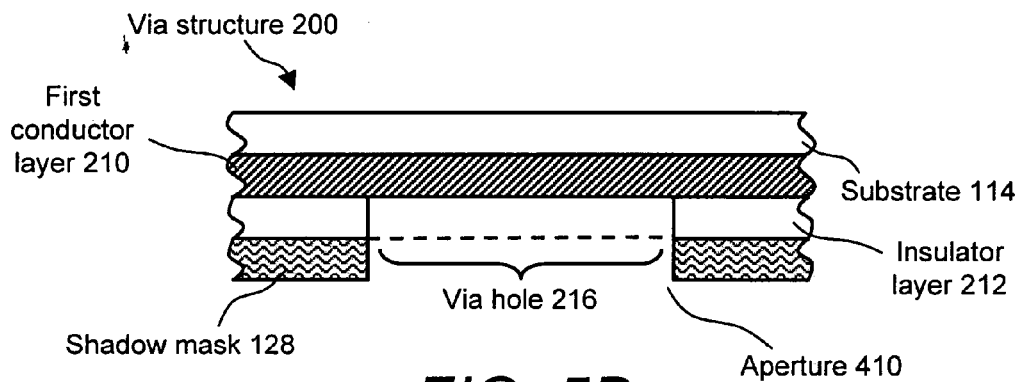
Figure 5C:
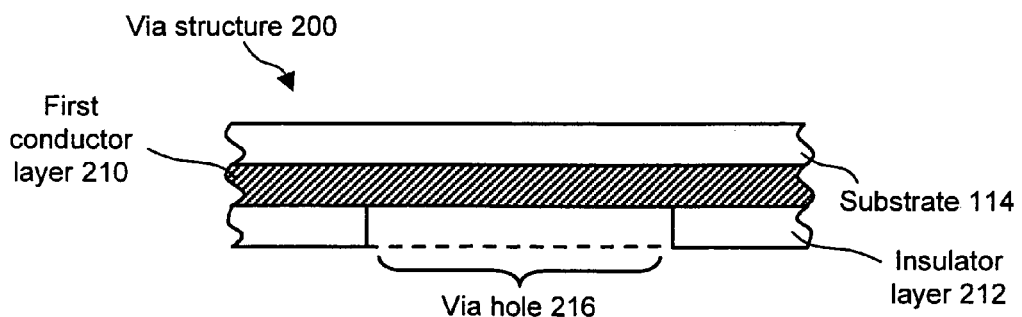

The method then advances to step 316, wherein via hole 216 is formed within insulator layer 212 by means of a plasma etch operation within plasma etch vacuum vessel 112 of production system 100. FIG. 5A shows shadow mask 128 in intimate contact with insulator layer 212 of via structure 200 and plasma gas from plasma source 126 of plasma etch vacuum vessel 112 passing through aperture 410 and impinging on the exposed surface of insulator layer 212, whereupon the exposed surface of insulator layer 212 is etched away. The surface of shadow mask 128 facing away from insulator layer 212 blocks the surface of insulator layer 212 that is outside aperture 410 from experiencing plasma etching. The duration of the plasma etch operation within plasma etch vacuum vessel 112 is suitably long to etch away the full thickness of insulator layer 212 to form via hole 216 within insulation layer 212, as shown in FIG. 5B. Desirably, the chemistry of the plasma gas is such that it does not etch away the material of first conductor layer 210. Thus, first conductor layer 210 serves inherently as an etch stop. FIG. 5B shows via structure 200 at the completion of the plasma etch operation and with shadow mask 128 still in intimate contact with insulator layer 212. FIG. 5C shows via structure 200 at completion of the plasma etch operation and with shadow mask 128 removed in preparation for the next deposition event.

The method then advances to step 318, wherein substrate 114 is advanced into, for example, deposition vacuum vessel 110c of production system 100 by use of the reel-to-reel system. Shadow mask 124c is then aligned and brought into intimate contact with substrate 114 and a second conductive layer, such as second conductor layer 214, is deposited by deposition source 120c through the aperture pattern of shadow mask 124c thereby completing the formation of via structure 200. Second conductor layer 214 is deposited atop insulator layer 212 and follows the contour of via hole 216, as shown in FIG. 2B, thereby forming an electrical connection (or defining an electrical conductor) between first conductor layer 210 and second conductor layer 214.

Figure 6A:
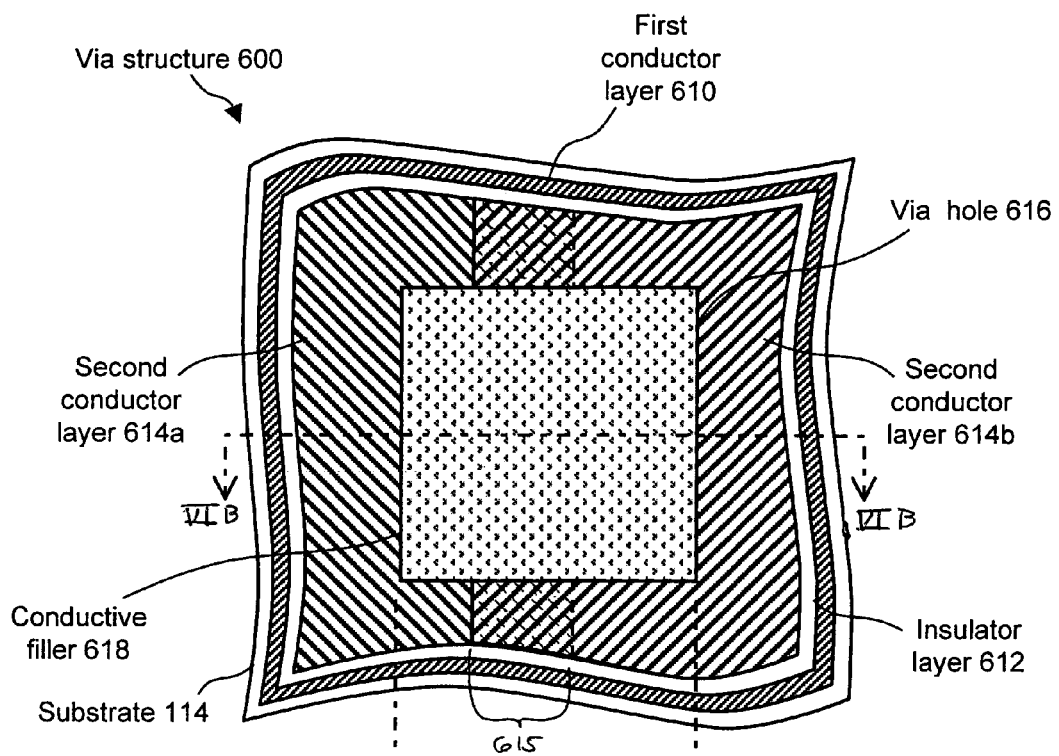
FIG. 6A is a top view of a via structure formed in a production system in accordance with a second embodiment of the invention.
Figure 6B:
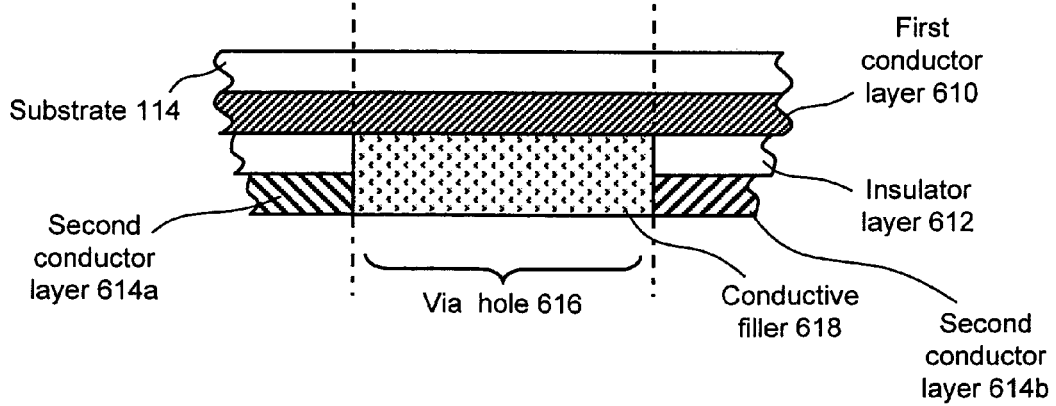
FIG. 6B is a cross section taken along line VIB-VIB in FIG. 6A.

With reference to FIGS. 6A and 6B a via structure 600 formed by use of production system 100 in accordance with a second embodiment of the invention includes a first conductor layer 610 deposited atop substrate 114; a non-conductive insulator layer 612 deposited atop first conductor layer 610; second conductor layers 614a and 614b deposited in the same plane atop insulator layer 612 with second conductor layer 614b slightly overlapping an area 615 of second conductor layer 614a, or vice versa; and a via hole 616 that is filled with a conductive filler 618. Conductive filler 618 serves as an electrical connection or electrical conductor between first conductor layer 610 and second conductor layers 614a and 614b. The shape of via hole 616 is not limited to a square since via hole 616 may be any desired shape, such as, without limitation, circular, oval or rectangular.

First conductor layer 610, second conductor layers 614a and 614b, and conductive filler 618 are formed of typical metals used to form interconnection layers in semiconductor fabrication. Examples of such metals include, without limitation, one or more of molybdenum, aluminum, gold, copper, nickel, titanium, metal alloys and other metal compounds. Insulator layer 612 is a non-conductive layer formed of any common circuit insulator material that can be etched, such as, without limitation, silicon dioxide ($SiO_2$), aluminum oxide ($Al_2O_3$), tantalum pentoxide ($Ta_2O_5$) and the like.

FIG. 6B shows that via hole 616 is a region within insulator layer 612 within which a portion of the surface of first conductor layer 610 is exposed and wherein conductive filler 618 is deposited to bridge the gap between first conductor layer 610 and second conductor layers 614a and 614b. In this way, an electrical connection is formed (or an electrical conductor is defined) between first conductor layer 610 and second conductor layers 614a and 614b. Outside the region defined by via hole 616, first conductor layer 610 is electrically isolated from second conductor layers 614a and 614b by insulator layer 612. The opening defined by via hole 616 within insulator layer 612 is formed by a plasma etch operation within plasma etch vacuum vessel 112 of production system 100, wherein a portion of the material of insulator layer 612 is removed.

It is envisioned that other conductive and/or non-conductive layers of material may be deposited on substrate 114, for simplicity, these conductive and/or non-conductive layers are not shown in FIGS. 6A and 6B. Furthermore, while via hole 616 is a single via that corresponds to a single conduction path, it is to be understood that via hole 616 is representative of one or more vias within a given multi-layer device structure.

Figure 7:
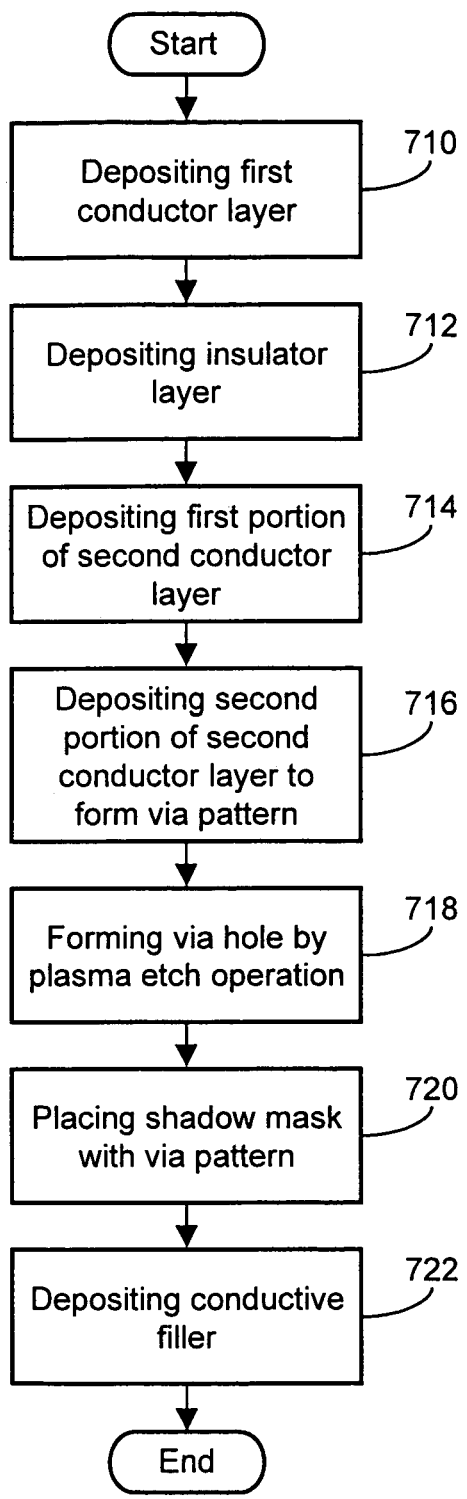
FIG. 7 is a flow diagram of a method of making the via structure of FIGS. 6A and 6B.

With reference to FIG. 7, and with continuing reference to FIGS. 1, 6A and 6B, a method 700 of making via structure 600 will now be described. For the purpose of method 700, production system 100 is configured differently than as shown in FIG. 1. More specifically, the vessels of production system 100 are configured serially in the following order: deposition vacuum vessel 110a, deposition vacuum vessel 110b, deposition vacuum vessel 110c, deposition vacuum vessel 110d, plasma etch vacuum vessel 112 and a deposition vacuum vessel 110e.

Method 700 includes step 710, wherein substrate 114 is advanced into, for example, deposition vacuum vessel 110a of production system 100 by use of the reel-to-reel system formed by dispensing reel 116 and take-up reel 118. Shadow mask 124a is then aligned and brought into intimate contact with substrate 114 and a first conductive layer, such as first conductor layer 610, is deposited on substrate 114 by deposition source 120a through the aperture pattern of shadow mask 124a.

The method then advances to step 712, wherein substrate 114 is advanced into, for example, deposition vacuum vessel 110b of production system 100 by use of the reel-to-reel system. Shadow mask 124b is then aligned and brought into intimate contact with substrate 114 and an insulator layer, such as insulator layer 612, is deposited on first conductor layer 610 by deposition source 120b through the aperture pattern of shadow mask 124b. At the completion of this step, insulator layer 612 is a continuous blanket or sheet of material with no openings therein.

The method then advances to step 714, wherein substrate 114 is advanced into, for example, deposition vacuum vessel 110c of production system 100 by use of the reel-to-reel system. Shadow mask 124c is then aligned and brought into intimate contact with substrate 114 and a first portion of a second conductive layer, such as second conductor layer 614a, is deposited on insulator layer 612 by deposition source 120c through the aperture pattern of shadow mask 124c. Shadow mask 124c is configured so that only the first portion of the second conductive layer, e.g., second conductive layer 614a, is deposited on insulator layer 612.

The method then advances to step 716, wherein substrate 114 is advanced into, for example, deposition vacuum vessel 110d of production system 100 by use of the reel-to-reel system. Shadow mask 124d is then aligned and brought into intimate contact with substrate 114 and a second portion of second conductive layer, such as second conductor layer 614b, is deposited on insulator layer 612 and area 615 of second conductor layer 614a by deposition source 120d through the aperture pattern of shadow mask 124d, thereby completing the formation of via structure 600 shown in FIGS. 6A and 6B. Shadow mask 124d is configured such that only the second portion of the second layer, such as second conductive layer 614b, is deposited on insulator layer 612 and area 615 of second conductor layer 614a. Upon completion of steps 714 and 716, an opening is formed in the region of via hole 616 by conductor layer 614a and 614b and the absence of conductive material in the region of via hole 616. A method of forming a via hole by at least two deposition events, is described in detail in U.S. patent application Ser. No. 11/020,907, filed on Dec. 22, 2004 (now U.S. Pat. No. 7,132,361), entitled, "System For And Method Of Forming Via Holes By Multiple Deposition Events In A Continuous Inline Shadow Mask Deposition Process," which is incorporated herein by reference.

Figure 8A:
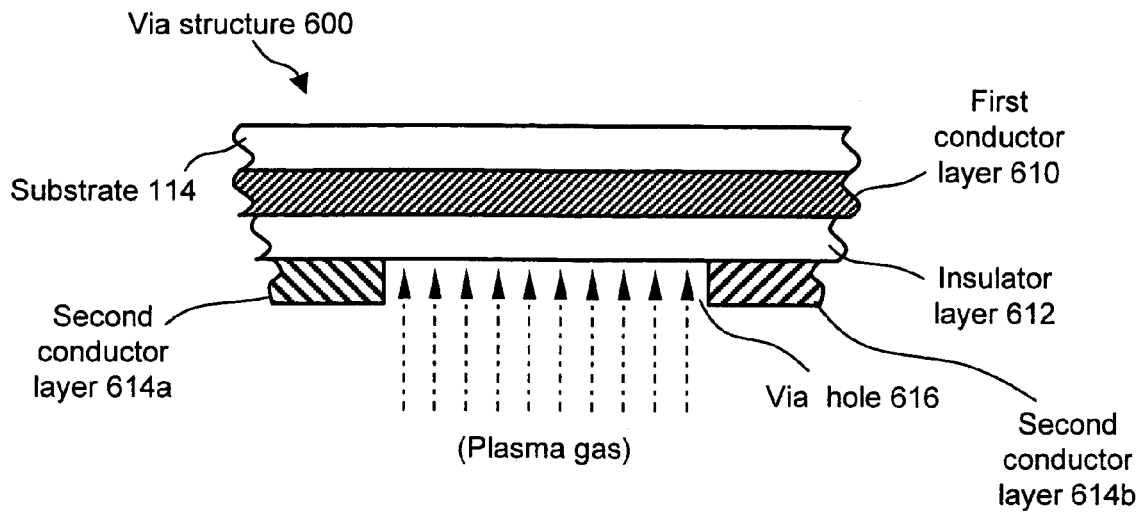
FIGS. 8A and 8B illustrate sequential process steps of forming a via hole of the via structure of FIGS. 6A and 6B.
Figure 8B:
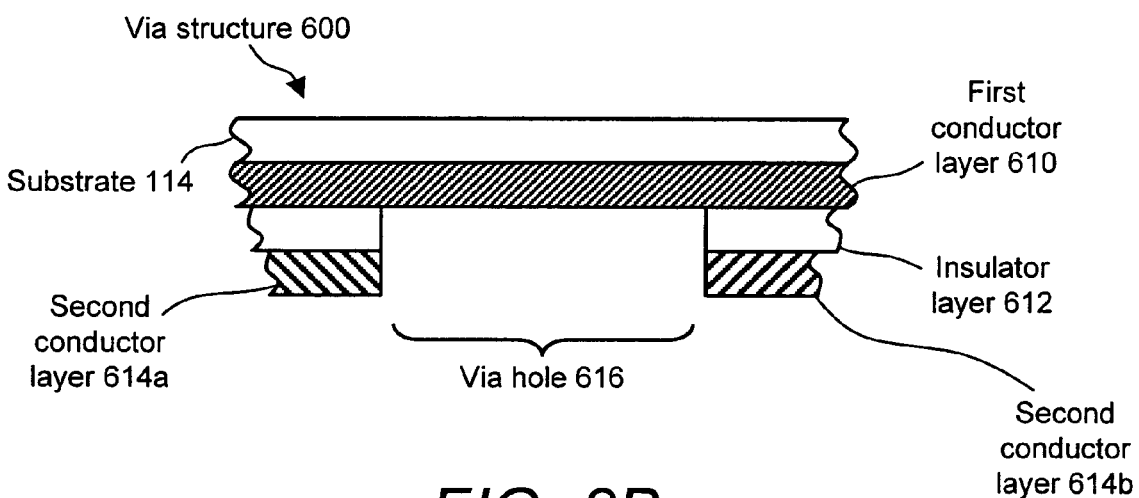

The method then advances to step 718, wherein substrate 114 is advanced into, for example, plasma etch vacuum vessel 112 of production system 100 by use of the reel-to-reel system. Via hole 616 is then formed within insulator layer 612 by means of a plasma etch operation shown in FIGS. 8A and 8B. FIG. 8A illustrates a cross sectional view of via structure 600 taken along line VIB-VIB of FIG. 6A. During the plasma etch operation, plasma gas from plasma source 126 of plasma etch vacuum vessel 112 passes through the opening formed by second conductor layers 614a and 614b at the region of via hole 616 and impinges upon the exposed surface of insulator layer 612, whereupon the exposed surface of insulator layer 612 is etched away. The surface of second conductor layers 614a and 614b facing away from insulator layer 612 block the surface of insulator layer 612 that is outside the region of via hole 616 from experiencing the plasma etch operation. Because second conductor layers 614a and 614b block the surface of insulator layer 612 that is outside the region of via hole 616 from experiencing the plasma etch operation, there is no need to utilize shadow mask 128 in plasma etch vacuum vessel 112 to protect the surface of insulator layer 612 outside the region of via hole 616 from the plasma etch operation. The duration of the plasma etch operation within plasma etch vacuum vessel 112 is suitably long to etch away the full thickness of insulator layer 612 to form via hole 616 within insulation layer 612, as shown in FIG. 8B. Desirably, the chemistry of the plasma gas is such that it does not etch away the material of first conductor layer 610 or of second conductor layers 614a and 614b. Therefore, first conductor layer 610 serves inherently as an etch stop.

Figure 4:
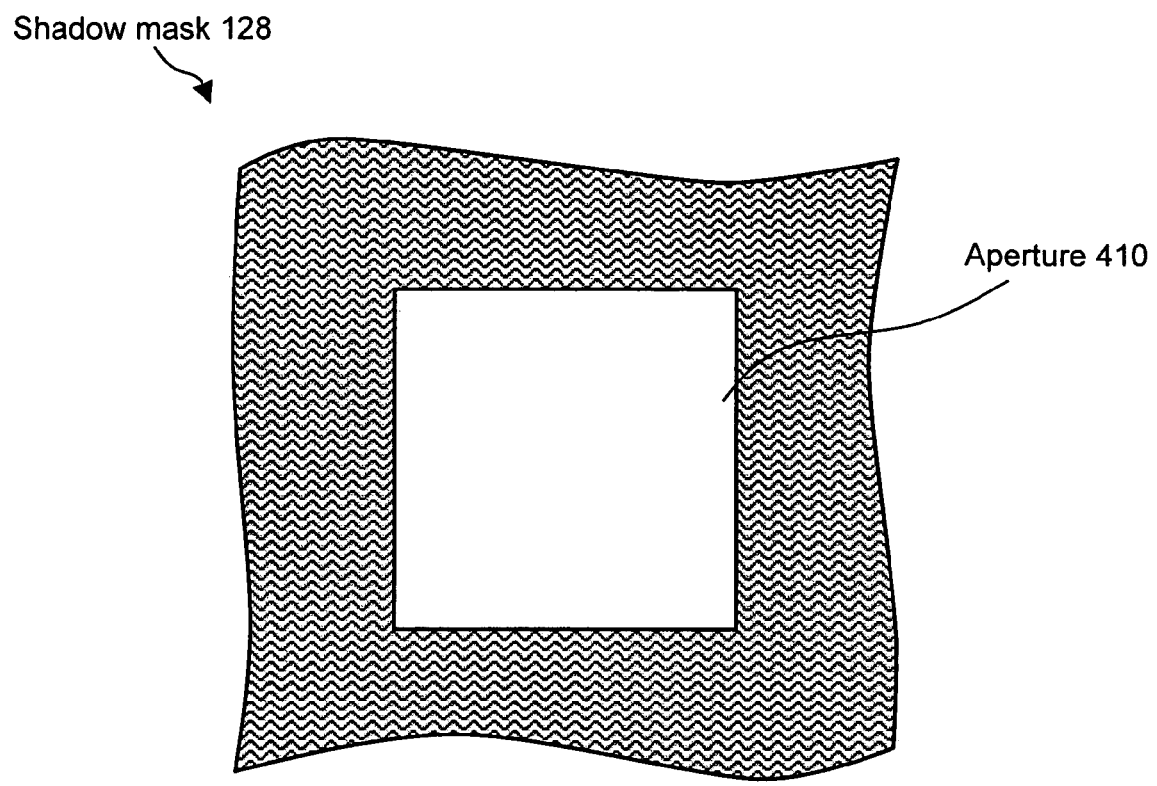
FIG. 4 is a top view of a portion of a shadow mask for use in a plasma etch operation in the production system of FIG. 1 for making the via structure of FIGS. 2A and 2B.
Figure 8C:
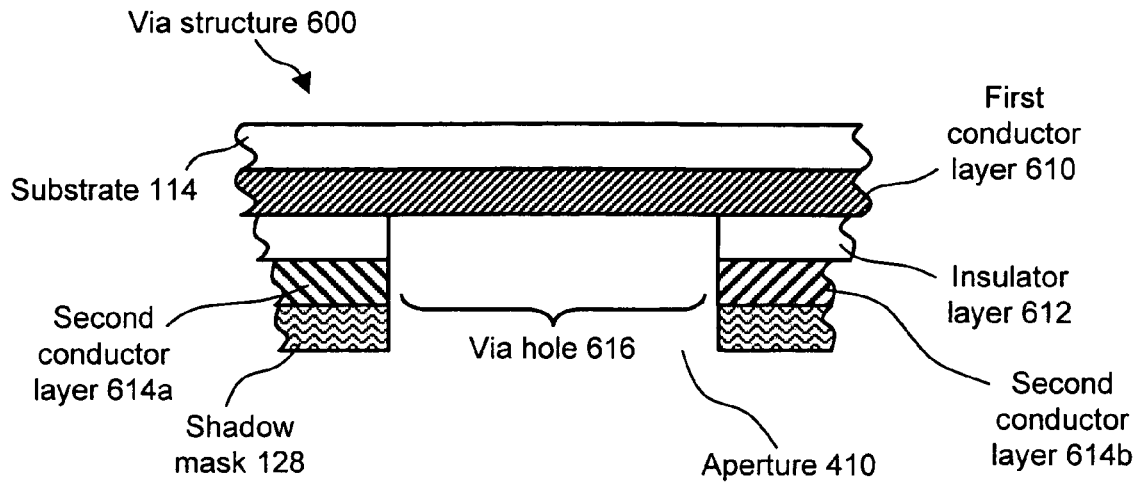
FIGS. 8C and 8D illustrate sequential process steps of filling the via hole of FIGS. 8A and 8B with a conductive filler by way of a shadow mask.

The method then advances to step 720, wherein substrate 114 is advanced into, for example, deposition vacuum vessel 110e of production system 100 by use of the reel-to-reel system. In method 700, shadow mask 128, a portion of which is shown in FIG. 4, is included in deposition vacuum vessel 110e. This is in contrast to method 300 where shadow mask 128 is included in plasma etch vacuum vessel 112, as shown in FIG. 1. Shadow mask 128 is then aligned and brought into intimate contact with second conductor layers 614a and 614b, as shown in FIG. 8C.

Figure 8D:
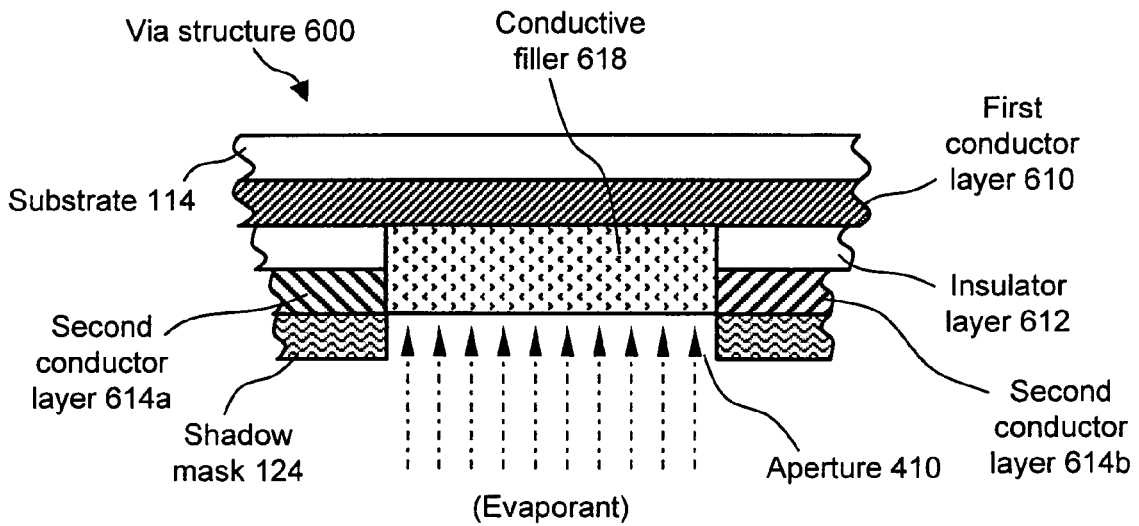

The method then advances to step 722, wherein a conductive filler, such as conductive filler 618, is deposited by deposition source 120e through the aperture pattern of shadow mask 128, as shown in FIG. 8D, thereby completing the formation of via structure 600. Conductive filler 618 forms an electrical connection (or defines an electrical connection) between first conductor layer 610 and second conductor layers 614a and 614b.

In summary, production system 100 of the present invention includes any user-desired configuration of one or more deposition vacuum vessels 110, within each of which occurs a shadow mask deposition event by use of a shadow mask, and one or more plasma etch vacuum vessels 112, within each of which occurs a plasma etch event by the use of a shadow mask or without the use of a shadow mask. The chemistry of plasma source 126 is such that it selectively etches away portions of an insulator layer which are left exposed through one or more apertures of a conductor layer or of a shadow mask that corresponds to a desired pattern of via holes. Production system 100 and methods 300 and 700 of the present invention provide a way of forming one or more via holes by use of selective plasma etching within one or more plasma etch vacuum vessels 112 that are easily integrated into the process flow in a manner that does not interrupt the continuous inline shadow mask deposition process for forming multi-layer electrical devices.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A shadow mask vapor deposition method comprising:
   (a) vapor depositing a first conductor layer on a substrate;
   (b) vapor depositing an insulator layer on the first conductor layer;
   (c) plasma etching the insulator layer via a shadow mask to define therein a via hole through which at least a portion of the first conductor layer is exposed; and
   (d) vapor depositing a second conductor layer on at least the insulator layer, wherein an electrical conductor in the via hole electrically connects the first and second conductor layers.

2. The method of claim 1, wherein a deposit of the second conductor layer in the via hole forms the electrical conductor.

3. The method of claim 1, wherein step (c) includes plasma etching the insulator layer by way of an aperture in a shadow mask to define the via hole in the insulator layer.

4. The method of claim 1, wherein:
   step (d) includes vapor depositing the second conductor layer in a manner to define an opening in the second conductor layer; and
   step (c) includes plasma etching the insulator layer by way of the opening in the second conductor layer to define the via hole in the insulator layer.

5. The method of claim 4, further including:
   (e) vapor depositing a conductive filler in the via hole by way of an aperture in a shadow mask and the opening in the second conductive layer whereupon the conductive filler forms the electrical conductor.

6. The method of claim 4, wherein step (d) includes:
   vapor depositing a first portion of the second conductor layer; and
   vapor depositing a second portion of the second conductor layer such that it overlaps the first portion of the second conductor layer, wherein the opening in the second conductor layer is formed solely by the vapor depositions of the first and second portions of the second conductor layer.

7. The method of claim 6, wherein each vapor depositing step occurs by way of a different shadow mask.

8. The method of claim 7, further including, before vapor depositing each layer, translating the substrate into a position with the corresponding shadow mask.

9. A shadow mask vapor deposition method comprising:
   (a) vapor depositing a first conductor on a substrate;
   (b) vapor depositing an insulator on the first conductor;
   (c) vapor depositing a second conductor on at least the insulator; and
   (d) plasma etching the insulator via a shadow mask, either before or after step (c), to define in the insulator a via hole through which at least a portion of the first conductor is exposed, wherein an electrical connection is established between the first and second conductors by way of the via hole.

10. The method of claim 9, wherein:
    when the via hole is defined before step (c), step (c) includes vapor depositing the second conductor in the via hole, thereby establishing the electrical connection between the first and second conductors; and
    when the via hole is defined after step (c), the method further includes vapor depositing a conductive filler in the via hole by way of an opening defined in the second conductor solely by the vapor deposition of the second conductor in step (c), whereupon the conductive filler establishes the electrical connection between the first and second conductors.

11. The method of claim 10, wherein:
    when the via hole is defined before step (c), the insulator is plasma etched by way of an aperture in a shadow mask; and
    when the via hole is defined after step (c), the insulator is plasma etched by way of the opening in the second conductor.

12. The method of claim 9, wherein:
    at least one of the first conductor and the second conductor is formed from at least one of molybdenum, aluminum, gold, copper, nickel and titanium; and
    the insulator is formed from one of silicon dioxide, aluminum oxide and tantalum pentoxide.

13. The method of claim 9, further including, before each vapor depositing step, translating the substrate into position to receive the corresponding vapor deposit.

14. A shadow mask vapor deposition system comprising:
    means for vapor depositing a first conductor on a substrate;
    means for vapor depositing an insulator on the first conductor;

means for vapor depositing a second conductor on at least the insulator; and means for plasma etching the insulator via a shadow mask, either before or after vapor depositing the second conductor, to define in the insulator a via hole through which at least a portion of the first conductor is exposed, wherein an electrical connection is established between the first and second conductors by way of the via hole.

15. The system of claim 14, wherein:

where the via hole is defined before vapor depositing the second conductor, the means for plasma etching includes a shadow mask having an aperture therein;

the insulator is plasma etched by way of the aperture in the shadow mask to form the via hole; and the means for vapor depositing the second conductor vapor deposits the second conductor in the via hole, thereby establishing the electrical connection between the first and second conductors.

16. The system of claim 14, wherein, where the via hole is defined after vapor depositing the second conductor, the means for vapor depositing the second conductor includes:

a first shadow mask for depositing a first portion of the second conductor; and a second shadow mask for depositing a second portion of the second conductor overlapping the first portion of the second conductor, wherein:

an opening is defined in the second conductor solely by the vapor deposition of the second conductor adjacent where the second portion of the second conductor overlaps the first portion of the second conductor; and the insulator is plasma etched by way of the opening.

17. The system of claim 16, further including means for vapor depositing a conductive filler in the via hole by way of an aperture in a shadow mask and the opening defined in the second conductor, whereupon the conductive filler establishes the electrical connection between the first and second conductors.

18. The system of claim 14, wherein each means for vapor depositing includes:

a vacuum vessel;

a deposition source disposed in the vacuum vessel and charged with a material to be deposited thereby; and a shadow mask disposed in the vacuum vessel and having a pattern of apertures corresponding to a desired pattern of the material to be deposited by the deposition source, wherein the shadow mask is positioned between the substrate and the deposition source during vapor depositing of the material.

19. The system of claim 18, wherein the means for plasma etching includes:

a vacuum vessel; and a plasma source disposed in the vacuum vessel.

20. The system of claim 19, further including means for translating the substrate into each vacuum vessel.

* * * * *